(12) United States Patent
Hosoi

(10) Patent No.: US 6,273,261 B1
(45) Date of Patent: Aug. 14, 2001

(54) IDENTIFICATION STRUCTURE OF A SUBSTRATE STORAGE CONTAINER AND METHOD OF IDENTIFYING A SUBSTRATE STORAGE CONTAINER

(75) Inventor: Masato Hosoi, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 09/542,635

(22) Filed: Apr. 4, 2000

(30) Foreign Application Priority Data

Apr. 30, 1999 (JP) .................................................. 11-124895

(51) Int. Cl.⁷ .................................................. B65D 85/48
(52) U.S. Cl. ........................ 206/711; 206/710; 206/459.5
(58) Field of Search ................. 206/454, 459.5, 206/710, 711, 712; 211/41.18

(56) References Cited

U.S. PATENT DOCUMENTS

| | | | |
|---|---|---|---|
| 5,390,785 | * | 2/1995 | Garric et al. ........................ 206/213.1 |
| 5,445,271 | * | 8/1995 | Kakizaki et al. .................. 206/459.5 |
| 5,476,176 | * | 12/1995 | Gregerson ............................ 206/711 |
| 5,755,332 | * | 5/1998 | Holliday et al. ...................... 206/711 |
| 5,873,468 | * | 2/1999 | Ejima et al. ........................... 206/711 |

* cited by examiner

*Primary Examiner*—David T. Fidei
(74) *Attorney, Agent, or Firm*—Darby & Darby

(57) ABSTRACT

The identification structure includes: a bottom plate screwed to the undersurface of a container body in which wafers are stored in alignment; a multiple number of passage holes bored in the bottom plate at identification areas thereof; and identification pieces to be selectively fitted to the multiple number of passage holes. The identification piece assumes a bottom-closed cylinder in which a pair of flange portions extend radially outward in all directions from the whole peripheral wall of the bottom-closed cylinder, at one and the other hollowed open ends so as to abut the periphery of the passage hole and that the flange portion at the hollowed opening end tapers from one end near to the closed end towards the other hollowed open end, forming an inclined insert surface. This bottom-closed cylinder can be fitted from either above or below the bottom plate. In this arrangement, the information about a substrate storage container is obtained based on the set mode of the identification piece.

19 Claims, 8 Drawing Sheets

IDENTIFICATION STRUCTURE OF A SUBSTRATE STORAGE CONTAINER AND METHOD OF IDENTIFYING A SUBSTRATE STORAGE CONTAINER

BACKGROUND OF THE INVENTION

1. Field of the Invention

The present invention relates a substrate storage container for storing and transporting substrates such as semiconductor wafers, mask glass substrates, liquid crystal cells, recording media, etc., as well as a substrate storage container for use in positioning such a substrate with respect to a processing machine for shaping and processing it, transportation from one processing machine to another and/or storage for future use. Particularly, the present invention relates to an identification structure for a substrate storage container as well as an method of identifying a substrate storage container for identifying its process stage, the substrate storage container type, the number of substrates stored therein, and the like.

2. Description of the Prior Art

With serious price competition of semiconductor devices, development of substrates relating to semiconductor manufacturing, such as semiconductor wafers (to be referred to merely as wafers hereinbelow), mask glass substrates etc., into large size in diameter (e.g., 300 mm or 400 mm or greater) have proceeded rapidly in order to improve production yield and hence reduce the cost. At the same time, since semiconductor circuits have been increasingly miniaturized, highly clean conditions have been demanded not only for the factories where substrates are manufactured but also for substrate storage containers used for transportation of the substrates.

As a method for meeting such demands, there are proposed methods whereby substrates are transported, whilst being put in a closable substrate storage container, between a number of sites which are locally kept in highly clean conditions required for processing the substrates. Under such circumstances, development of substrate storage containers capable of being automatically conveyed without permitting the stored substrates to be contaminated and still directly accessible to the processing machine are in progress.

A substrate storage container 1 of wafers used for their transportation, reservation, positioning them to the processing machines, and the like comprises, as shown in FIGS. 1 and 2, a container body for holding a multiple number of wafers in alignment and a door element for sealingly closing the open front of the container body with a gasket interposed therebetween and is set to processing machine 30.

Attached to the undersurface of the container body is a bottom plate or bottom plate portion (to be referred generally to bottom plate hereinbelow). This bottom plate has a plurality of V-shaped grooves (kinematic couplings, hereafter V-shaped grooves), which function to position the container body when substrate storage container 1 is mounted to a processing machine 30. A gasket is interposed between the container body and door element to keep the sealed state of substrate storage container 1. A locking mechanism that is operable from the outside is incorporated in the door element and its engaging claws engage the open front of the container body creating sealed confinement.

A wafer processing machine 30 has a load port 31 for mounting substrate storage container 1, as shown in FIGS. 1 and 2. The surface of this load port 31 has a detecting means 32 for identification projections and single or multiple interlock pins 33, arranged apart from one another. This interlock pin 33 is to prevent substrate storage container 1 from being mounted and coupled erroneously.

In the above configuration, when wafers are processed and shaped, substrate storage container 1 is first mounted and coupled to load port 31 of processing machine 30 via its bottom plate. Then the locking mechanism of the door element is unlocked so that the engaging claws are disengaged from the engagement holes in the front side of the container body, whereby the door element that has closed the front side of the container body is removed. After removal of the door element, wafers are loaded from the inside of substrate storage container 1 and taken into processing machine 30, where the wafers are subjected to the predetermined process.

Generally, in semiconductor device manufacturing, in order to avoid contamination (adverse influences on wafer's characteristics due to adhesion of particles, organic molecules, inorganic molecules and the like to the wafer's surface) of the semiconductor storage containers 1 used before and after wafer's membrane forming, the substrate storage containers 1 to be used for handling the wafers before metal deposition are discriminated particularly from the substrate storage containers 1 to be used for storing the wafers after the treatment. From this viewpoint, a substrate storage container 1A to be used on the wafer loading side (to be referred to as a fore stage) in which wafers will be subjected to a metal deposition process is distinguished from a substrate storage container 1B to be used after metal deposition (to be referred to as an aft stage), by providing different identification projections and indentations as shown in FIGS. 1 and 2, thus providing easy identification.

FIGS. 1 and 2 are schematic diagrams showing substrate storage containers 1A and 1B with load ports 31 (31A and 31B) of processing machine 30. FIG. 1 shows a load port 31A of processing machine 30 in the fore stage and a substrate storage container 1A suited thereto. FIG. 2 shows a load port 31B of processing machine 30 in the aft stage and a substrate storage container 1B suited thereto.

As stated above, since the processing and shaping of wafers in semiconductor device manufacturing are complicated and manifold, substrate storage container 1 may be contaminated in some cases depending upon the wafers to be stored. For example, when the wafers at the fore stage is stored, uncontaminated substrate storage containers 1 are discriminated from contaminated substrate storage containers 1 and are used. Processing machine 30 or substrate processing equipment are designed so as to be able to handle all types of semiconductor storage containers 1 since it is assumed that various types of semiconductor storage containers 1 should be used depending upon various processing stages of wafers or depending upon semiconductor device manufactures. However, handling operations of substrate storage containers 1 in automation differ one from another depending upon the type of the substrate storage container 1, so that substrate storage containers 1 need to be discriminated and individual types handled selectively.

The types of substrate storage containers 1 include, for example, a closed container type called 'FOUP' (Front Opening Unified Pod), a substrate shipping container type called 'FOSB' (Front Opening Shipping Box) having almost the same configuration as a FOUP, and an open cassette type called 'OC'. Each type of substrate storage container 1, further has two types, one which can hold thirteen wafers and the other which can hold twenty five wafers.

Accordingly, even with the same main part, substrate storage containers 1 have different specs of identification portions for discriminating one for the fore wafer processing stage from one for the aft wafer processing stage. Therefore, for manufacture of substrate storage containers 1, it is necessary to mold them by preparing two different metallic molds for molding substrate storage containers 1. Alternatively, it is necessary to provide a nesting configuration so that the identification portion can be replaced. However, these methods need multiple metallic molds and multiple die parts, resulting in large investment for the preparation of metallic molds. Further, it is difficult to identify the type of the container bodies formed by molding from their appearance, so that complicated production and inventory managements of the products are needed or there is a risk that type contamination may occur in the assembly and inspection stages of substrate storage containers 1.

Further, since the method heretofore has many complex stages, it has been very difficult for semiconductor device manufacturing using substrate storage containers 1 to exactly know which of the either substrate storage containers 1A, to be used for the fore stage or the substrate storage containers 1B to be used for the aft stage are lacking. Therefore, if substrate storage containers 1 are lacking, the manufacturer needs to order the substrate storage containers in short delivery intervals or needs to have two types of substrate storage containers 1A and 1B. Conventionally, for identifying the types of substrate storage containers 1A and 1B, and the number of wafers accommodated therein, an identification means such as of projections and indentations has been integrally formed with, or attached separately to, substrate storage container 1. These needed fixing such as by the use of screws, welding or the like and an extra step for assembly of substrate storage container 1.

SUMMARY OF THE INVENTION

The present invention has been devised in view of the above problems, and it is therefore an object of the present invention to provide an identification structure of a substrate storage container and method of identifying a substrate storage container, whereby it is possible to reduce the investment for metallic molds and the like and realize simple product management and ready grasp of the information as to substrate storage containers and allow for relatively simple attachment.

In order to achieve the above object, the present invention is configured as follows:

In accordance with the first aspect of the present invention, an identification structure of a substrate storage container which holds substrates in a container body with a door element sealingly closed over the open front of the container body, includes: a bottom plate provided on the undersurface of the container body; a passage hole provided for the bottom plate in an identification area thereof; and an identification piece detachably disposed to the passage hole, wherein the information about a substrate stage container is obtained based on attached state of the identification piece.

In accordance with the second aspect of the present invention, the identification structure of a substrate storage container having the above first feature is characterized in that the identification piece is of a pillar fitting to the passage hole of the bottom plate, a pair of flange portions that are formed on the peripheral wall of the pillar, extend radially outward and will abut the periphery of the passage hole are formed apart from each other, one of the flange portions tapers from one end toward the other end, forming an inclined insert surface, and the pillar can be fitted from either above or below the bottom plate.

In accordance with the third aspect of the present invention, the identification structure of a substrate storage container having the above first feature is characterized in that the identification piece is of a pillar fitting to the passage hole of the bottom plate and having a flat surface at one end and a hollowed opening at the other end, a pair of flange portions that are formed on the peripheral wall of the pillar, extend radially outward and will abut the periphery of the passage hole are formed apart from each other.

In accordance with the fourth aspect of the present invention, the identification structure of a substrate storage container having the above first feature is characterized in that the identification piece is of a pillar fitting to the passage hole of the bottom plate and having a flat surface at one end and a hollowed opening at the other end, a pair of flange portions that are formed on the peripheral wall of the pillar, extend radially outward and will abut the periphery of the passage hole are formed apart from each other, one of the flange portions tapers from one end toward the other end, forming an inclined insert surface, and the pillar can be fitted from either above or below the bottom plate.

In accordance with the fifth aspect of the present invention, the identification structure of a substrate storage container having the above second feature is characterized in that the identification piece is a bottom-closed cylinder.

In accordance with the sixth aspect of the present invention, the identification structure of a substrate storage container having the above third feature is characterized in that the peripheral wall of the pillar of the identification piece has a slit formed extending from one open end to the other end thereof.

In accordance with the seventh aspect of the present invention, the identification structure of a substrate storage container having the above fourth feature is characterized in that the peripheral wall of the pillar of the identification piece has a slit formed extending from one open end to the other end thereof.

In accordance with the eighth aspect of the present invention, a method of identifying a substrate storage container is characterized in that a bottom plate is provided on the undersurface of a container body which holds substrates with a door element sealingly closed over the opening face, a passage hole is provided for the bottom plate in an identification area, and an identification piece is detachably disposed to the passage hole, the method being characterized in that the identification piece is fitted from either above or below the bottom plate, and the information about a substrate stage container is obtained based on attached state of the identification piece.

In accordance with the above first and eighth features of the present invention, the identification piece is fitted to the passage hole in the identification area from either above or below the bottom plate of the container body. Based on the attached state, or the position of the identification part, the various information about the substrate storage container can be obtained. For example, the process through which the substrate storage container is used, the type of the substrate storage container and/or the number of substrates, etc. can be known. Further, it is also possible to discriminate the substrate storage container from other substrate storage containers. Since the substrate storage container and identification piece are separated from each other and the identification piece is attached using the passage hole, it is possible to obtain two kinds of container bodies using a single metallic mold for the container body.

In accordance with the second to seventh features of the present invention, when the pillar or identification piece is fitted to the passage hole in the identification area, the inclined insert surface of the flange portion facilitates easy fitting. Further, a pair of flanges extending from the peripheral wall of the pillar are set holding the passage hole in between so as to prevent the identification piece from falling from the passage hole.

DESCRIPTION OF THE PREFERRED EMBODIMENTS

Figure 1:
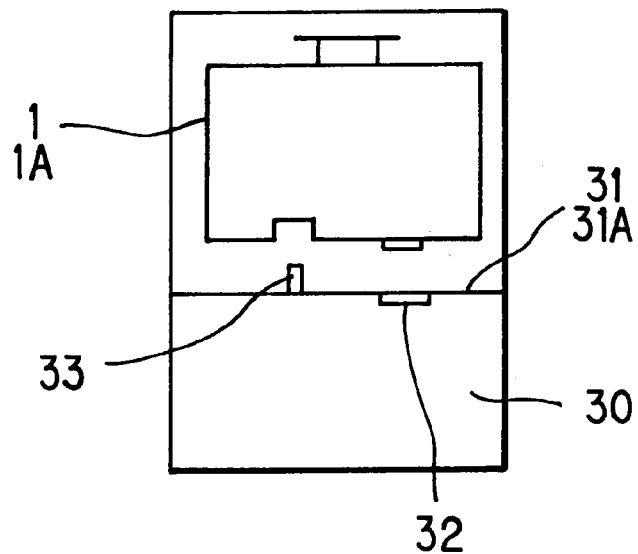
FIG. 1 is an illustration showing a state in which a substrate storage container used for a fore stage is mounted on a load port.
Figure 2:
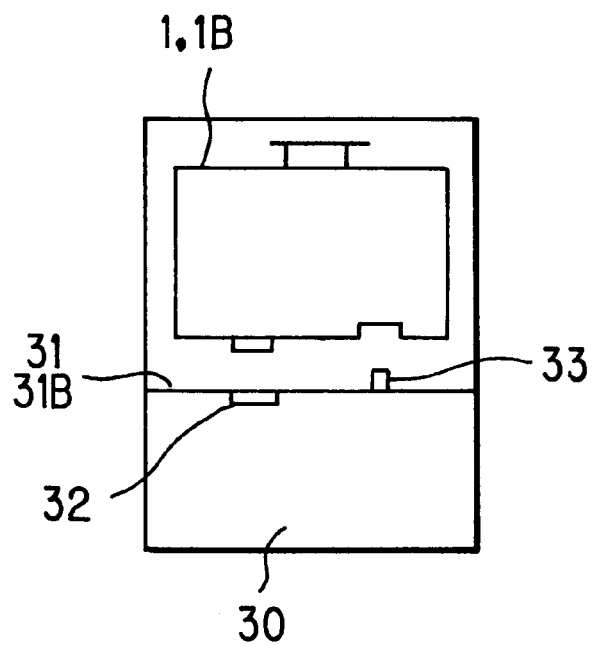
FIG. 2 is an illustration showing a state in which a substrate storage container used for an aft stage is mounted on a load port.

Preferred embodiments of the present invention will hereinafter be described with reference to the accompanying drawings, but the embodiments herein should not limit the present invention.

The substrates in the present invention at least include a single or plural semiconductor wafers (Si, GaP, etc.), mask glass substrates, liquid crystal cells, recording media and the like. The door element may incorporate a locking mechanism or may have it omitted. The bottom plate may be provided integrally to the undersurface of the container body or may be of a separate element which can be attached in a removable manner. Formed in the identification areas in this bottom plate can be a single or plural passage holes of various shapes. This passage hole and mating identification piece may be closely or not so closely fitted with each other. The identification piece may be formed of metal, synthetic resin or other materials and may be provided singular or plural in number, correspondingly to the number of the passage holes. For a sensor to achieve easy detection, the identification piece may be colored.

The identification piece is of a pillar. Examples of pillar at least include cylindrical columns, rectangular columns, polygonal columns, bottom-closed cylinders, bottom-closed polygonal pipes, bottom-closed elliptic pipes and bottom-closed oval pipes. The pillar may be of a length almost fitting inside, or protruding above, the mating passage hole. The pillar may have a flange. This flange may be formed so that it projects outward from the whole outer peripheral wall of the pillar. A plurality of flanges may project outward from parts of the peripheral wall of the pillar. Also the flange may be formed so that it projects outward from the peripheral wall at the end of the pillar or from the peripheral wall at a position other than the end. Further, the end part of the pillar may be flat or with projections and hollows.

The identification structure of a substrate storage container and identifying method therefor in the present embodiment, as shown in FIGS. 3 through 8A, 8B and 8C, comprise: a container body 2 that stores a multiple number (13 pieces or 25 pieces) of wafers W in alignment with its open front being closed hermetically with a door element 12 with a gasket 11 interposed in between; a bottom plate 15 removably screwed to the undersurface of container body 2; passage holes 18A, 18B, 18C and 18D, bored at multiple identification areas of bottom plate 15; and identification pieces 19 to be selectively fitted to these multiple passage holes 18A, 18B, 18C and 18D.

Container body 2 is molded from a synthetic resin such as polycarbonate, acrylic resin, etc., to be an open-box configuration at least having a transparent portion at a position so that the alignment of wafers W stored inside can be viewed while having a high enough strength, rigidity and transparency. This container body should be formed based on the SEMI standards, and may be formed with an antistatic finish as required. This container body 2 has a rim portion 3 which outwardly protrudes vertically and sidewards from the periphery of the open front. The inner stepped surface of rim portion 3 forms a sealing surface 4. Formed projectedly on both sides of rim portion 3 at the middle height are a pair of engaged portions 5.

Figure 3:
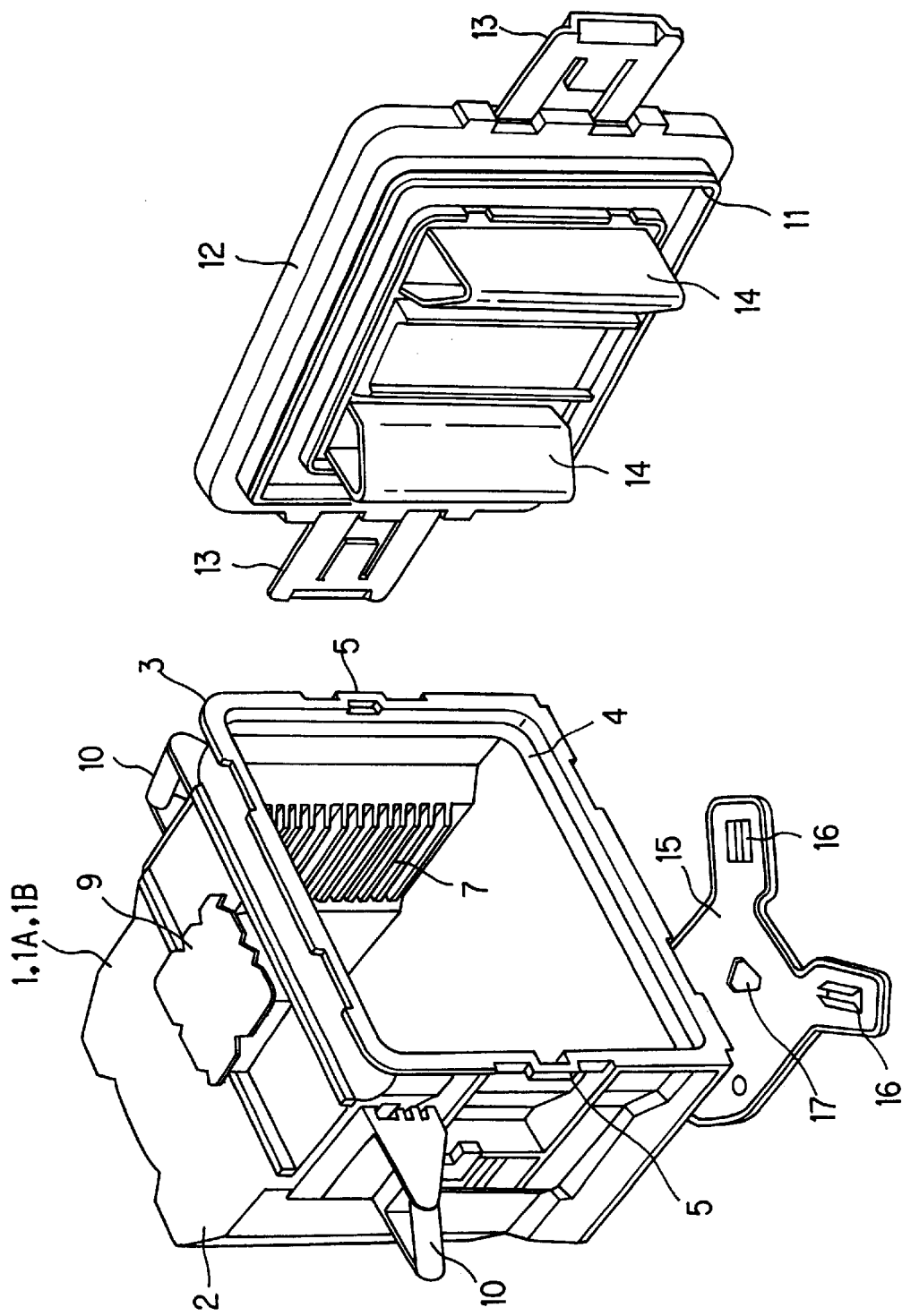
FIG. 3 is an exploded perspective view showing a substrate storage container to which an embodiment of the identification structure of a substrate storage container and method of identifying a substrate storage container according to the present invention is applied.
Figure 4:
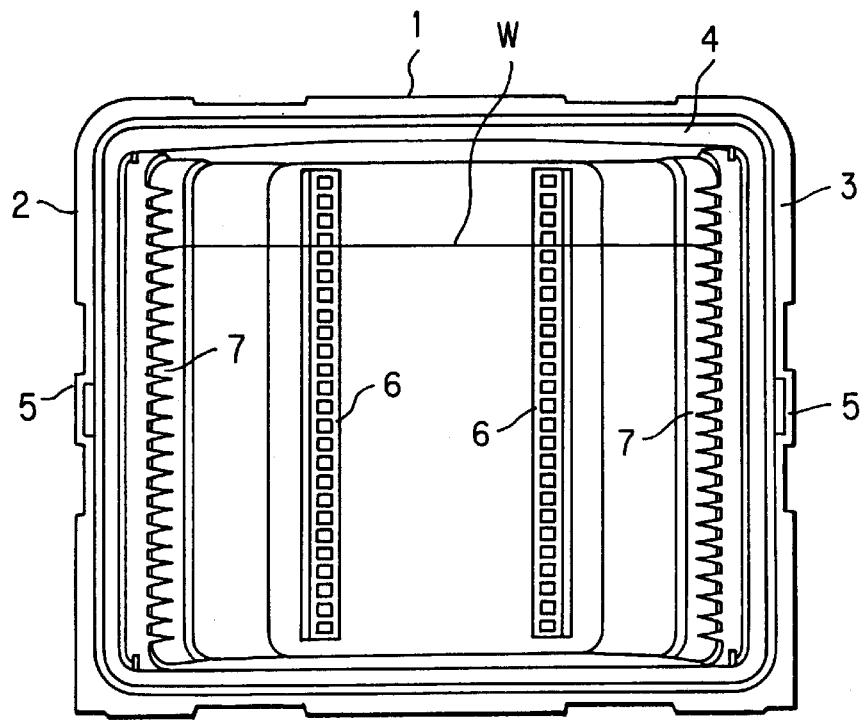
FIG. 4 is a front view showing a state where the door element is removed from the substrate storage container shown in FIG. 3.

Referring to FIGS. 3 and 4, a pair of rear supports 6 are integrally formed or detachably screwed and arranged apart on the inner rear surface of container body 2 while a plurality of horizontal suspending grooves 7 are formed in a vertical arrangement on both the left and right interior side walls. These suspending grooves 7 on one interior side wall are arranged so as to oppose the suspending grooves 7 on the opposite interior side wall. Each rear support 6 is formed as a rectangular column using a forming material having the predetermined elasticity, specifically, polyethylene resin, polypropylene resin, or thermoplastic elastomer such as polyester elastomer, polyolefine elastomer etc., for reducing contamination. Each suspending groove 7 is formed so as to have a U-shaped or V-shaped section and elastically and horizontally supports a wafer W on its outer edge.

Based on the SEMI standards, three V-shaped grooves 8 having an approximately V-shaped section are formed projectedly and integrally on the undersurface of container body 2, two at sites to the left and right on the front side, one at the rear center. These multiple V-shaped grooves 8 are mated with corresponding positioning pins on the surface of a load port 31 of a processing machine 30, thus providing a positioning function. As shown in FIG. 3, a robotic flange 9, which is called 'OHT(overhead hoist transportation)', is detachably screwed on the top of container body 2. This robotic flange 9 is held by an unillustrated transporting means. A pair of handles 10 are detachably disposed, as required, on both exterior side faces of container body 2 so as to allow for emergency use.

Gasket 11 is molded in a frame shape of thermoplastic elastomer, fluororubber, silicone rubber, or the like and is detachably fitted on container body 2 or door element 12 via a groove, projection or the like. When door element 12 is fitted to cover, the gasket is held between rim portion 3 of container body 2 and door element 12 and pressed against sealing surface 4 of rim portion 3 to provide sealing.

As shown in FIG. 3, door element 12 is molded of the same synthetic resin as container body 2 or a different synthetic resin, and has a pair of engaging pieces 13 pivotally hinged on both sides thereof. These engaging pieces 13 will be fitted with engaged portions 5 so that door element 12 is firmly fitted against rim portion 3 of container body 2. A singular or multiple front retainers 14 are detachably fixed on the inner face of door element 12. These front retainers 14 and rear supports 6 hold wafers W therebetween while wafers W are transported.

Door element 12 may be formed so as to be hollow, in order to incorporate a locking mechanism (not shown) having a latch mechanism which can be operated manually or automatically. In this case, the locking mechanism causes multiple engaging claws, which can project and retract, to fit corresponding engagement holes formed on the inner periphery of rim portion 3, whereby door element 12 is fitted to rim portion 3 of container body 2.

Front retainer 14 is molded of an elastic material, specifically, polyethylene resin, polypropylene resin, thermoplastic elastomer such as polyester elastomer, polyolefine elastomer etc., fluororubber, or the like.

Figure 5:
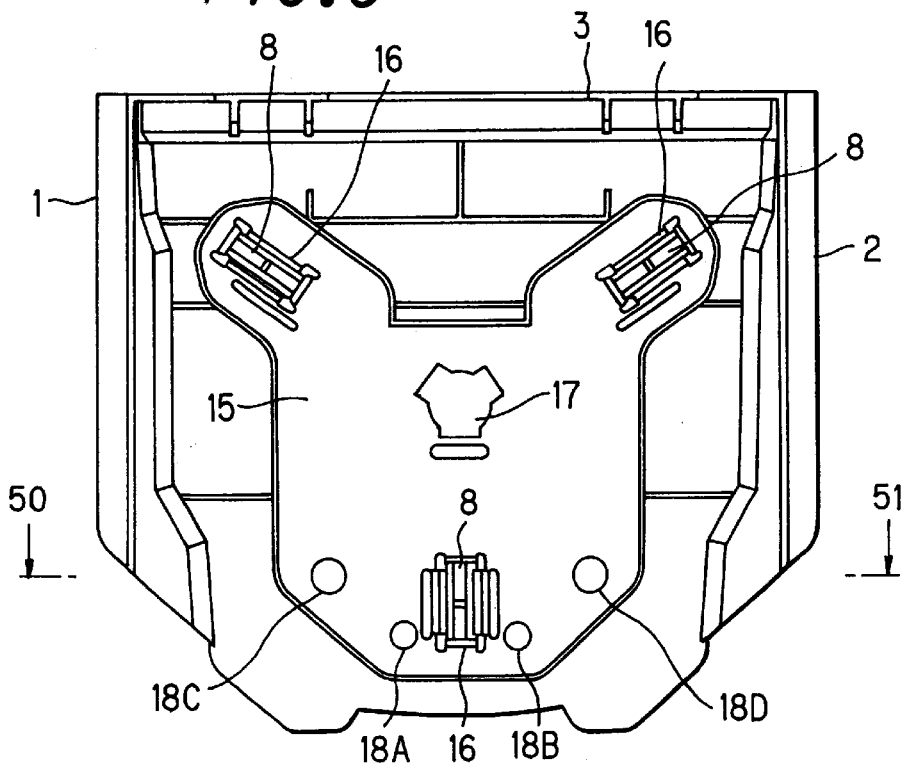
FIG. 5 is a bottom view showing the substrate storage container shown in FIG. 3.

Bottom plate 15 is molded as an approximately Y-shaped plate element as shown in FIGS. 3 and 5 using a synthetic resin having good wear resistance, such as polyether-ether-ketone, polybutylene terephthalate, polycarbonate and other resins. This bottom plate has upward and downward projections formed along its entire outer periphery. Bottom plate 15 has engaging pieces 16 formed, two at left and right sites on the front side and one at the rear center so as to mate multiple V-grooves 8. Each engaging piece 16 has inclined surfaces, which guides the positioning pin to V-shaped groove 8. Formed in the center of bottom plate 15 is a passage-hole 17, through which container body 2 is detachably fixed to processing machine 30.

Based on the SEMI standards, a plurality of identification areas are disposed on both sides in the rear part of bottom plate 15, as shown in FIG. 5. These identification areas are formed with circular passage holes 18A, 18B, 18C and 18D.

According to the SEMI standards, in container body 2, identifying projections or indentations should be formed at positions A and B on both sides in the rear part of the undersurface, which correspond to positions X21 and Y10 specified by the SEMI standards E1.9, E47.1, E31, and at positions C and D on both sides in the rear part of the undersurface, which correspond to positions X22 and Y9.

Position A is used to indicate the storage capacity of wafers W. Specifically, a projection of 9 mm high or greater from the reference surface of load port 31 at position A indicates a substrate storage container 1 for 25 pieces, whereas a projection of 2 mm high or less from the reference surface indicates a substrate storage container 1 for 13 pieces. Position B is used to indicate the type of substrate storage container 1. Specifically, in the same manner as of position A, a projection of 9 mm high or greater from the reference surface of load port 31 at position B indicates a substrate storage container 1 of a FOUP or FOSB type, whereas a projection of 2 mm high or less from the reference surface indicates an open cassette.

Positions C and D, where an indentation and projection are attached, are used to indicate the difference of the process to which substrate storage container 1 is subjected. That is, for a substrate storage container 1A to be used for the fore stage in wafer processing, an identification projection of 9 mm high or greater from the horizontal reference surface of load port 31A of processing machine 30 and still capable of avoiding interference with interlock pin 33, needs to be arranged at position D in the fourth quadrant in the XY coordinate system having its origin point at the center of the undersurface of container body 2. Further, another identification projection of 2 mm high or less from the horizontal reference surface for detecting the presence of substrate storage container 1A, needs to be arranged at position C in the third quadrant.

In the undersurface of substrate storage container 1A to be used for the fore stage in the wafer processing, an identification projection of 2 mm high or less from the horizontal reference surface for detecting the presence of container body 2, needs to be arranged at position C in the third quadrant in the XY coordinate system having its origin point at the center of container body 2 while another identification projection of 9 mm high or greater from the horizontal reference surface of processing machine 30 and still capable of avoiding interference with interlock pin 33 planted on load port 31 of processing machine 30, needs to be arranged at position D which has the same Y-coordinate value in the fourth quadrant.

In contrast, for a substrate storage container 1B to be used for the aft stage in the wafer processing, an identification projection of 2 mm high or less projecting downwards from the horizontal reference surface of processing machine 30 needs to be arranged at position D in the fourth quadrant while another identification projection of 9 mm high or greater from the horizontal reference surface of processing machine 30 needs to be arranged at position C in the third quadrant. In this embodiment, under consideration of the above SEMI specifications, passage holes 18A, 18B, 18C and 18D are formed in bottom plate 15 at positions correspondingly to the plurality of identification areas. Identification pieces 19 are selectively fitted into these passage holes 18A, 18B, 18C and 18D.

Figure 6A:
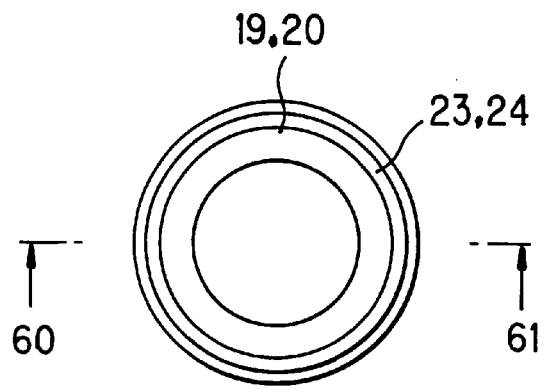
FIGS. 6A to 6C are illustrative views showing an identification piece in an embodiment of the identification structure of a substrate storage container and method of identifying a substrate storage container according to the present invention, FIG. 6A being a plan view, 6B being a front view and 6C being a sectional view taken along a line 60–61 in FIG. 6A.
Figure 6B:
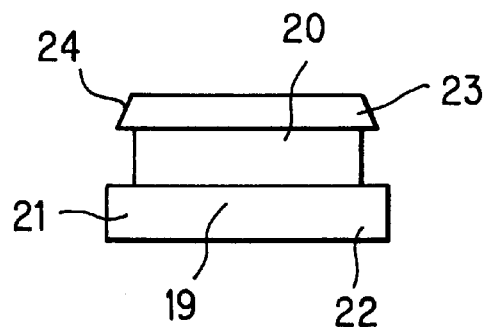
Figure 6C:
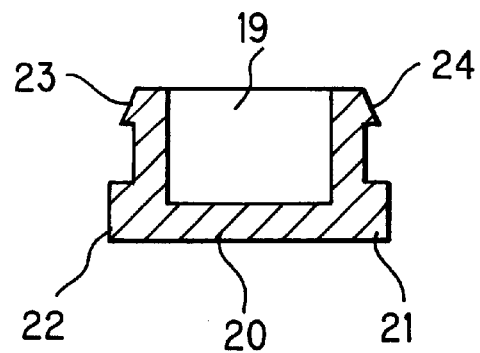

Identification piece 19 is a bottom-closed cylinder 20, as shown in FIGS. 6A, 6B and 6C, formed of a synthetic resin such as polycarbonate, acrylic resin, polypropylene, polyethylene or thermoplastic elastomer such as polyolefine elastomer, polyester elastomer, etc. These bottom-closed cylinders 20 are fitted into each of passage holes 18A, 18B, 18C and 18D from above or below bottom plate 15. Based on the fitted state, the optical sensors etc., of processing machine 30 obtains the information about substrate storage container 1. Bottom-closed cylinder 20 has at its one end a flange portion 21 that extends in all directions radially outward so as to engage the periphery of passage hole 18A, 18B, 18C and 18D, forming a flat detection rim 22. Formed at the other hollowed end of bottom-closed cylinder 20 is another deformable flange portion 23 that extends in all directions radially outward so as to engage the periphery of passage hole 18A, 18B, 18C and 18D. This flange portion 23 is configured so that the rim tapers from the side near to the closed end towards the hollowed end, forming an inclined insert surface 24. This inclined insert surface 24 allows easy insert into passage holes 18A, 18B, 18C and 18D.

Figure 7A:
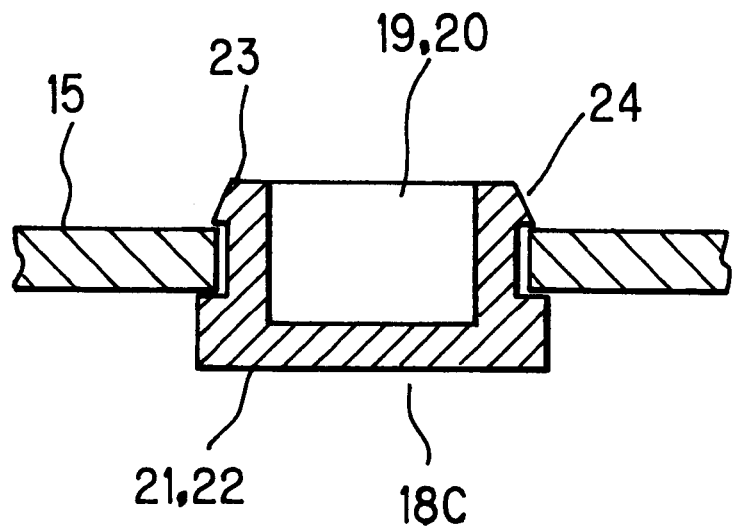
FIGS. 7A and 7B are illustrative sectional views cut along a line 50–51 in FIG. 5, FIG. 7A being a sectional view showing a state where an identification piece is fitted in a position at an identification area C in a fore-stage substrate storage container, FIG. 7B being a sectional view showing a state where an identification piece is fitted in a position at an identification area D in a fore-stage substrate storage container.
Figure 7B:
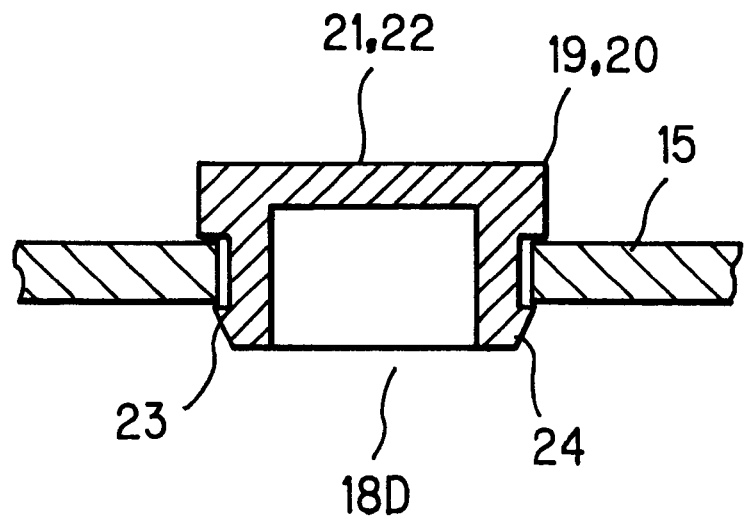

FIGS. 7A and 7B show identification pieces 19 attached to a fore-stage substrate storage container 1A. In this case, an identification piece 19 is fitted at the position of identification area D from the upper side of bottom plate 15 so that its bottom is positioned upward, forming an identification projection that avoids interference with interlock pin 33. Fitted at the position of identification area C is another identification piece 19 from the lower side of the bottom plate so that detection rim 22 is positioned downward and hence this detection rim 22 is detected by detecting means 32.

Figure 8A:
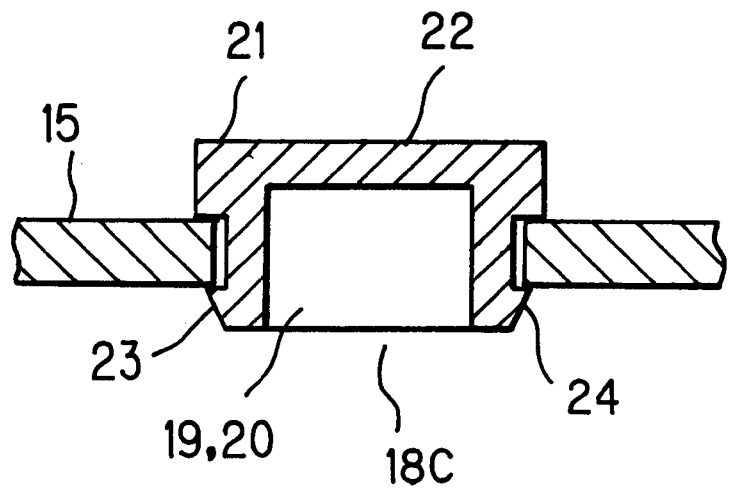
FIGS. 8A and 8B are illustrative sectional views cut along a line 50–51 in FIG. 5, FIG. 8A being a sectional view showing a state where an identification piece is fitted in a position at an identification area C in an aft-stage substrate storage container, FIG. 8B being a sectional view showing a state where an identification piece is fitted in a position at an identification area D in an aft-stage substrate storage container.
Figure 8B:
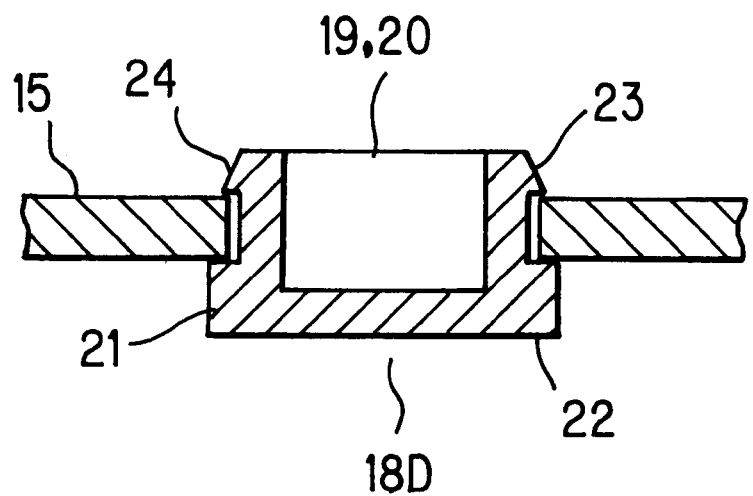

In contrast, FIGS. 8A and 8B show identification pieces 19 attached to an aft-stage substrate storage container 1B. In this case, an identification piece 19 is fitted at the position of identification area C from the upper side of bottom plate 15 so that its bottom is positioned upward, forming an identification projection that avoids interface with interlock pin 33. Fitted at the position of identification area D is another identification piece 19 from the lower side of the bottom plate so that detection rim 22 is positioned downward and hence is detected by detecting means 32.

In accordance with the above configuration, identification pieces 19 that indicate the usage of substrate storage container 1 are provided as simple, light-weight parts separated from container body 2 and are attached to passage holes 18A, 18B, 18C and 18D that are positioned at the identification areas of bottom plate 15. Thus, since identification pieces 19 can be set posteriorly in accordance with orders received even with a single metallic mold for container body 2, the metallic mold of a single kind easily provides two types of container bodies 2, thus markedly reducing the investment for metallic molds and hence realizing a sharp reduction in cost. Further, there is no need to attach screws in the identification areas or provide projections, therefore the product configuration and the arrangement of the metallic mold can be remarkably simplified, leading to sharp reduction in equipment investment and production cost.

Since identification pieces 19 can be attached or removed in a simple manner without screwing, welding and the like, it is possible to easily change the specifications of substrate storage container 1, leading to no necessity of holding the two types in stock. Since identification pieces 19 of a type can be commonly used, the management can be markedly simplified. Since use of identification pieces 19 enables markedly easy discrimination of container body 2 from other types, the production management and stock management of the products can be simplified and there is no risk in that substrate containers 1 will be erroneously mixed with other types during the assembly stage or inspection stage of them, thus causing contamination.

Figure 9A:
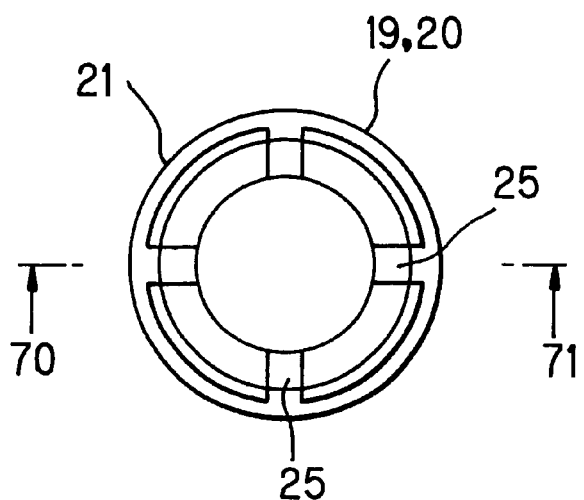
FIGS. 9A to 9C are illustrative views showing an identification piece in another embodiment of the identification structure of a substrate storage container and method of identifying a substrate storage container according to the present invention, FIG. 9A being a plan view, 9B being a front view and 9C being a sectional view taken along a line 70–71 in FIG. 9A.
Figure 9B:
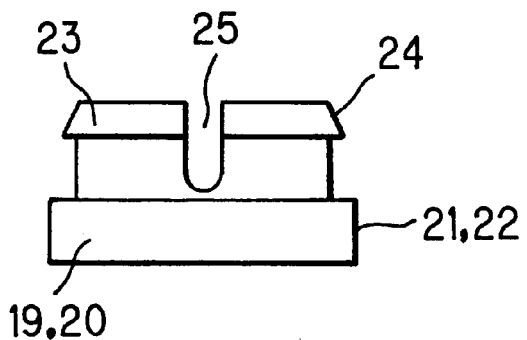
Figure 9C:
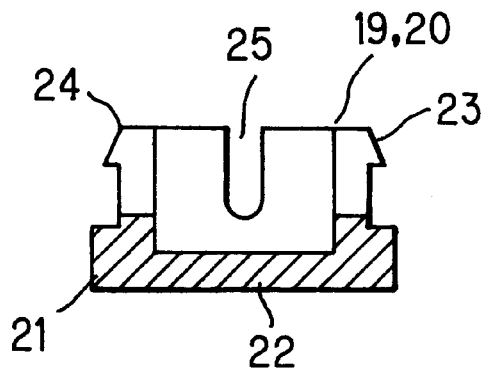

Next, FIGS. 9A, 9B and 9C show the second embodiment of the present invention. In this case, a plurality (four in this embodiment) of slits 25 are notch-formed at intervals of a predetermined distance along the peripheral wall of bottom-closed cylinder 20. Each slit 25 is formed in a U shape from the hollowed end toward closed end of bottom-closed cylinder 20. Other portions are formed in the same manner as the above embodiment, so that description is omitted.

This embodiment also provides the operational effects as in the above embodiment. Further, since this identification piece 19 is formed as a hollowed, bottom closed cylinder 20 with multiple slits 25 cut out, the peripheral wall of bottom-closed cylinder 20 can flex radially inward and outward. Accordingly, the degree of deformability of identification piece 19 is markedly improved, thus it is obvious that identification piece 19 can be attached and removed easily.

Figure 10A:
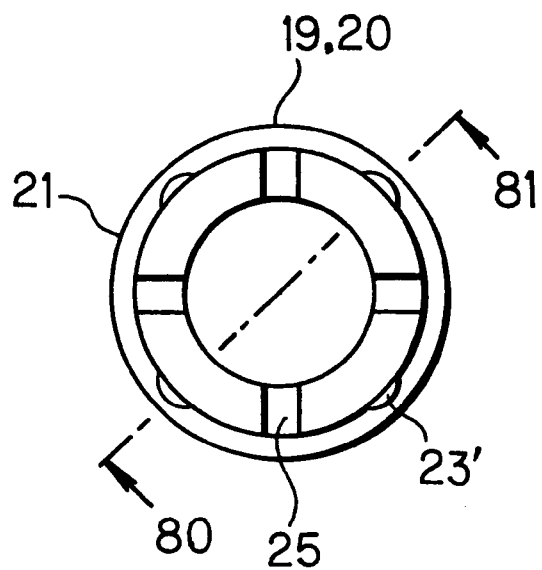
FIGS. 10A to 10C are illustrative views showing an identification piece in still another embodiment of the identification structure of a substrate storage container and method of identifying a substrate storage container according to the present invention, FIG. 10A being a plan view, 10B being a front view and 9C being a sectional view taken along a line 80–81 in FIG. 10A.
Figure 10B:
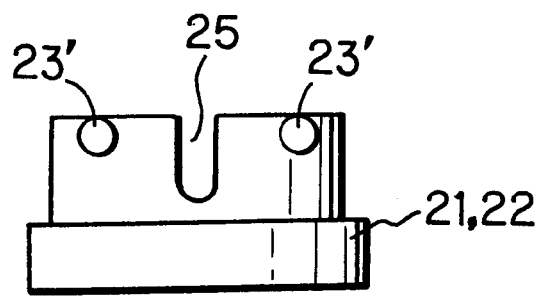
Figure 10C:
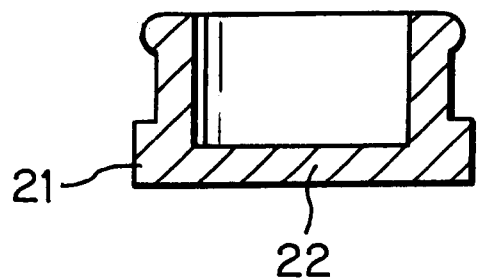

FIGS. 10A, 10B and 10C show the third embodiment of the present invention, where a plurality of hemispherical projections 23' are formed as the flange portion on the periphery of the hollowed end of the bottom-closed cylinder. Other parts are the same as the above embodiment so that the description is omitted.

In the above embodiments, a configuration in which bottom plate 15 is attached by fitting into a plurality of V-shaped grooves 8 integrally formed with container body 2 is described, but the present invention should not be limited to this. For example, bottom plate 15 maybe bonded or screwed to the bottom face of container body 2 and/or multiple V-shaped grooves 8. Also, bottom plate 15 and multiple engaging pieces 16 may be either integrally or separately formed. Further, if additional identification areas other than above are formed and multiple number of identification pieces 19 are attached in combination, a variety of information can be given. Moreover, four slits 25 are cut out in the peripheral wall of bottom-closed cylinder 20, but the number and shape of slits 25 may be changed as appropriate.

As has been described heretofore, in accordance with the present invention, it is possible to suppress the equipment investment in the metallic molds etc. and simplify the production management, and the present invention is effective in grasping the information as to a substrate storage container, in a simple way.

What is claimed is:

1. An identification structure of a substrate storage container which holds substrates in a container body with a door element sealingly closed over the open front of the container body, comprising:
    a bottom plate provided on an undersurface of the container body;
    a passage hole provided for the bottom plate in an identification area thereof; and
    an identification piece detachably disposed to the passage hole, wherein information about the substrate storage container is obtained based on attached state of the identification piece.

2. The identification structure of a substrate storage container according to claim 1, wherein the identification piece is of a pillar fitting to the passage hole of the bottom plate, a pair of flange portions that are formed on the peripheral wall of the pillar, extend radially outward and will abut the periphery of the passage hole are formed apart from each other, one of the flange portions tapers from one end toward the other end, forming an inclined insert surface, and the pillar can be fitted from either above or below the bottom plate.

3. The identification structure of a substrate storage container according to claim 1, wherein the identification piece is of a pillar fitting to the passage hole of the bottom plate and having a flat surface at one end and a hollowed opening at the other end, a pair of flange portions that are formed on the peripheral wall of the pillar, extend radially outward and will abut the periphery of the passage hole are formed apart from each other.

4. The identification structure of a substrate storage container according to claim 1, wherein the identification piece is of a pillar fitting to the passage hole of the bottom plate and having a flat surface at one end and a hollowed opening at the other end, a pair of flange portions that are formed on the peripheral wall of the pillar, extend radially outward and will abut the periphery of the passage hole are formed apart from each other, one of the flange portions tapers from one end toward the other end, forming an inclined insert surface, and the pillar can be fitted from either above or below the bottom plate.

5. The identification structure of a substrate storage container according to claim 2, wherein the identification piece is a bottom-closed cylinder.

6. The identification structure of a substrate storage container according to claim 3, wherein the peripheral wall of the pillar of the identification piece has a slit formed extending from one open end to the other end thereof.

7. The identification structure of a substrate storage container according to claim 4, wherein the peripheral wall of the pillar of the identification piece has a slit formed extending from one open end to the other end thereof.

8. A method of identifying a substrate storage container, wherein a bottom plate is provided on an undersurface of a container body which holds substrates with a door element sealingly closed over an opening face, a passage hole is provided for the bottom plate in an identification area, and an identification piece is detachably disposed to the passage hole, wherein the identification piece is fitted from either above or below the bottom plate, and information about the substrate storage container is obtained based on an attached state of the identification piece.

9. The identification structure of a substrate storage container according to claim 1, wherein the bottom plate is detachably coupled to the undersurface of the container body.

10. The identification structure of a substrate storage container according to claim 1, wherein the attached state includes at least one of a physical characteristic of the identification piece and a position of the identification piece.

11. The identification structure of a substrate storage container according to claim 10, wherein the physical characteristic is a projection height from a reference surface of a substrate processing machine.

12. The identification structure of a substrate storage container according to claim 11, wherein the reference surface is a surface on a substrate processing machine which includes a detector for detecting the attached state of the identification piece.

13. The identification structure of a substrate storage container according to claim 1, wherein the identification piece has predefined physical characteristics which provide information about the substrate storage container based on a relationship between the identification piece and a reference surface.

14. An identification structure of a substrate storage container which holds substrates in a container body with a door element sealingly closed over an open front of the container body, comprising:
   a bottom plate provided on an undersurface of the container body;
   a plurality of passage holes formed in multiple identification areas of the bottom plate; and
   a plurality of identification pieces detachably disposed in the plurality of passage holes, wherein information about the substrate storage container is obtained based on an orientation of each of the identification pieces relative to the bottom plate and which one of the passage holes the respective identification piece is disposed in.

15. The identification structure of a substrate storage container according to claim 14, wherein each of the identification pieces is of a pillar fitting to one of the passage holes of the bottom plate, a pair of flange portions that are formed on a peripheral wall of the pillar, extend radially outward and will abut a periphery of the passage hole are formed apart from each other, one of the flange portions tapers from one end toward another end, forming an inclined insert surface, and the pillar can be fitted from either above or below the bottom plate.

16. The identification structure of a substrate storage container according to claim 14, wherein each identification piece is of a pillar fitting to one passage hole of the bottom plate and having a flat surface at one end for detection by a detector and a hollowed opening at an opposite end which is free from detection by the detector, a pair of flange portions that are formed on a peripheral wall of the pillar, extend radially outward and will abut a periphery of the passage hole are formed apart from each other.

17. The identification structure of a substrate storage container according to claim 14, wherein the bottom plate is detachably coupled to the undersurface of the container body.

18. The identification structure of a substrate storage container according to claim 14, wherein the identification piece has a hollow end and a closed end and the orientation of the identification piece is determined by which of the hollow and closed ends is disposed closer to the container body.

19. The identification structure of a substrate storage container according to claim 18, wherein the location of each passage hole has an associated value relaying information about the substrate storage container.

* * * * *